US011581450B2

(12) United States Patent
Levy et al.

(10) Patent No.: US 11,581,450 B2
(45) Date of Patent: Feb. 14, 2023

(54) PHOTODIODE AND/OR PIN DIODE STRUCTURES WITH ONE OR MORE VERTICAL SURFACES

(71) Applicant: GLOBALFOUNDRIES U.S. INC., Santa Clara, CA (US)

(72) Inventors: Mark D. Levy, Williston, VT (US); Siva P. Adusumilli, South Burlington, VT (US); Vibhor Jain, Williston, VT (US); John J. Ellis-Monaghan, Grand Isle, VT (US)

(73) Assignee: GLOBALFOUNDRIES U.S. INC., Malta, NY (US)

( * ) Notice: Subject to any disclaimer, the term of this patent is extended or adjusted under 35 U.S.C. 154(b) by 190 days.

(21) Appl. No.: 16/899,028

(22) Filed: Jun. 11, 2020

(65) Prior Publication Data
US 2021/0391489 A1    Dec. 16, 2021

(51) Int. Cl.
*H01L 31/101* (2006.01)
*H01L 31/107* (2006.01)
*H01L 31/18* (2006.01)
*H01L 31/0352* (2006.01)

(52) U.S. Cl.
CPC .... *H01L 31/107* (2013.01); *H01L 31/035281* (2013.01); *H01L 31/1804* (2013.01)

(58) Field of Classification Search
CPC ............... H01L 31/107; H01L 31/1804; H01L 31/035281; H01L 31/00–02027
See application file for complete search history.

(56) References Cited

U.S. PATENT DOCUMENTS

| | | | |
|---|---|---|---|
| 7,361,526 B2 | 4/2008 | Maa et al. |
| 7,397,101 B1 | 7/2008 | Masini et al. |
| 7,777,250 B2 | 8/2010 | Lochtefeld |
| 7,790,495 B2 | 9/2010 | Assefa et al. |
| 7,795,064 B2 | 9/2010 | Pan et al. |
| 8,513,759 B2 | 8/2013 | Iguchi et al. |
| 9,064,699 B2 | 6/2015 | Wang et al. |
| 9,864,138 B2 | 1/2018 | Coolbaugh et al. |
| 10,157,947 B2 | 12/2018 | Chen et al. |
| 2007/0099315 A1 | 5/2007 | Maa et al. |
| 2008/0070355 A1 | 3/2008 | Lochtefeld et al. |
| 2011/0037133 A1 | 2/2011 | Su et al. |
| 2014/0159183 A1 | 1/2014 | Na |
| 2016/0155884 A1 | 6/2016 | Hon et al. |
| 2018/0204761 A1 | 7/2018 | Feilchenfeld et al. |

FOREIGN PATENT DOCUMENTS

WO    2008036256    3/2008

OTHER PUBLICATIONS

D. Knoll et al.," High-performance BiCMOS Si photonics platform", IEEE Xplore, 2015, 9 pages.

*Primary Examiner* — Suberr L Chi
(74) *Attorney, Agent, or Firm* — Francois Pagette; Andrew M. Calderon; Calderon Safran & Cole, P.C.

(57) ABSTRACT

The present disclosure relates to semiconductor structures and, more particularly, to photodiodes and/or PIN diode structures and methods of manufacture. The structure includes: at least one vertical pillar feature within a trench; a photosensitive semiconductor material extending laterally from sidewalls of the at least one vertical pillar feature; and a contact electrically connecting to the photosensitive semiconductor material.

20 Claims, 3 Drawing Sheets

US 11,581,450 B2

PHOTODIODE AND/OR PIN DIODE STRUCTURES WITH ONE OR MORE VERTICAL SURFACES

FIELD OF THE INVENTION

The present disclosure relates to semiconductor structures and, more particularly, to photodiodes and/or pin diode structures and methods of manufacture.

BACKGROUND

An avalanche photodiode (APD) is a highly sensitive semiconductor photodiode that exploits the photoelectric effect to convert light into electricity. From a functional standpoint, the avalanche photodiode can be regarded as the semiconductor analog of photomultipliers. Typical applications for avalanche photodiodes are long-range fiber-optic telecommunication and quantum sensing for control algorithms. Newer applications include positron emission tomography and particle physics.

Avalanche photodiode applicability and usefulness depends on many parameters. Two factors, for example, are quantum efficiency and total leakage current. Quantum efficiency indicates how well incident optical photons are absorbed and then used to generate primary charge carriers; whereas, total leakage current is the sum of the dark current, photocurrent and noise.

Photodiode sensitivity is dependent on the length of the path of light through the photosensitive material and the ability of generated carrier pairs to reach the electrode/contact/cathode. In conventional structures, the carriers travel in a two dimensional pathway, e.g., vertically or laterally, which results in a long pathway. Due to the longer pathways of conventional avalanche photodiodes, there is a high frequency of photon recombination within the photosensitive material resulting in signal loss or weakening of the signal, itself. Moreover, the photosensitive material itself needs to be very thick, which is expensive and time consuming to grow, and which can make integration with other circuit elements more challenging.

SUMMARY

In an aspect of the disclosure, a structure comprises: at least one vertical pillar feature within a trench; a photosensitive semiconductor material extending laterally from sidewalls of the at least one vertical pillar feature; and a contact electrically connecting to the photosensitive semiconductor material.

In an aspect of the disclosure, a structure comprises: a trench within substrate material; a deep n-well implant region under the trench; shallow trench isolation regions isolating the trench; at least one vertical pillar feature extending upwardly within the trench; an insulator material at a bottom of the trench; and a photosensitive material above the insulator material and embedding the at least one vertical pillar feature.

In an aspect of the disclosure, a method comprises: forming at least one vertical pillar feature within a trench; forming a photosensitive semiconductor material extending laterally from sidewalls of the at least one vertical pillar feature; forming a contact electrically connecting to the photosensitive semiconductor material; and semiconductor material lining the photosensitive material.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

Figure 1A:
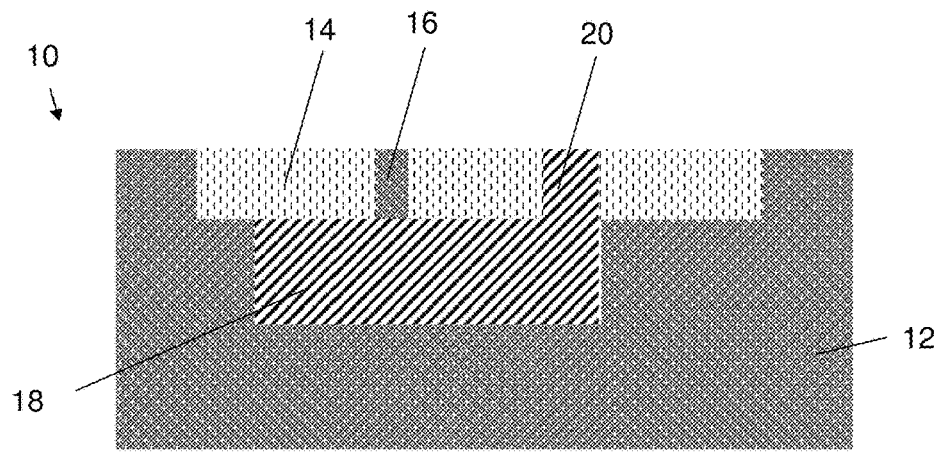
FIG. 1A shows a cross-sectional view of a substrate with a vertical pillar feature, amongst other features, and respective fabrication processes in accordance with aspects of the present disclosure.

The present disclosure relates to semiconductor structures and, more particularly, to photodiodes and/or pin diode structures and methods of manufacture. More specifically, the present disclosure relates to avalanche photodiodes (APD) and/or pin diode structures with one or more vertical surfaces (e.g., vertical pillar features). Advantageously, the avalanche photodiodes described herein exhibit increased sensitivity due to a particular form factor, e.g., dome shaped, while also providing a decrease time for growth of photodetector material (e.g., Ge) by implementing the use of the vertical pillar feature, e.g., increased semiconductor area for laterally growing the photodetector material. Moreover, the photodiode can be integrated with existing technologies, while also providing a reduced chance of defective regions from growth fronts merging together from different planes.

In embodiments, the photodiodes and/or pin diode structures include an intrinsic photodetector material (e.g., intrinsic Ge material) grown around one or more vertical features (e.g., vertical pillar features) within a trench to allow for integration with FETs and other devices. The photodetector material is grown laterally from the one or more vertical pillar features, resulting in semiconductor material embedded in the Ge region. In further embodiments, the vertical pillar features can be doped or undoped Si material. An oxide (dielectric) layer is provided below the Ge material, within the trench and on a top surface of the pillar(s). The oxide material will act as a reflector, as well as prevent Ge material or other photoreactor material from growing in unwanted regions. In addition, p+ poly Si or Si contacts can be provided above the photodetector material, with p and n+ regions in the substrate. Moreover, reach through contacts can be provided to the n+ regions. The photodiode structures are also viable for frontside and backside illumination due to the focusing nature of the shape of the photoreactor material, e.g., domed shape Ge material which increases sensitivity.

The photodiodes and/or pin diode structures of the present disclosure can be manufactured in a number of ways using a number of different tools. In general, though, the methodologies and tools are used to form structures with dimensions in the micrometer and nanometer scale. The methodologies, i.e., technologies, employed to manufacture the photodiodes and/or pin diode structures of the present disclosure have been adopted from integrated circuit (IC) technology. For example, the structures are built on wafers and are realized in films of material patterned by photolithographic processes on the top of a wafer. In particular, the fabrication of the photodiodes and/or pin diode structures uses three basic building blocks: (i) deposition of thin films of material on a substrate, (ii) applying a patterned mask on top of the films by photolithographic imaging, and (iii) etching the films selectively to the mask.

Figure 1B:
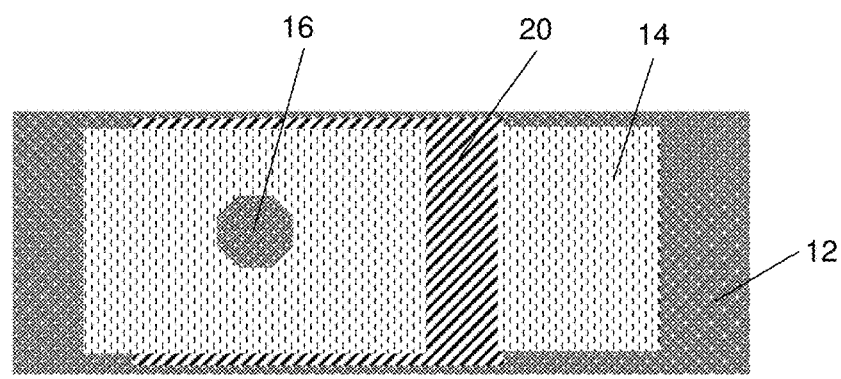
FIG. 1B shows a top view of the substrate with the vertical pillar feature shown in FIG. 1A.

FIG. 1A shows a cross-sectional view of a substrate with a vertical pillar feature, amongst other features, and respective fabrication processes in accordance with aspects of the present disclosure. FIG. 1B shows a top view of the substrate with the vertical pillar feature shown in FIG. 1A. More specifically, FIGS. 1A and 1B show a structure 10 comprised of a substrate 12. In embodiments, the substrate 12 can be any bulk semiconductor material. For example, the substrate 12 may be composed of, but not limited to, Si, SiGe, SiGeC, SiC, GaAs, InAs, InP, and other III/V or II/VI compound semiconductors. The substrate material 12 is preferably p-doped material.

Still referring to FIGS. 1A and 1B, shallow trench isolation structures 14 are formed within the substrate 12, surrounding a portion 16 of the substrate material 12. In embodiments, the portion 16 of the substrate material is a vertical pillar feature as described in more detail herein. As shown in more detail in FIG. 1B, the vertical pillar feature 16 can be octagonal in shape; although other shapes are also contemplated herein. For example, the vertical pillar feature 16 can be diamond, octagon, circular, rectangular, square, or other shape which will facilitate the growth of photodetector material. Although a single vertical pillar feature 16 is shown in FIGS. 1A and 1B, it is understood that multiple vertical pillar features 16 are contemplated herein as shown, for example, in FIGS. 6 and 7.

The shallow trench isolation structures 14 can be fabricated by conventional lithography, etching and deposition methods known to those of skill in the art. For example, a resist formed over the substrate material 12 is exposed to energy (light) to form a pattern (opening). An etching process with a selective chemistry, e.g., reactive ion etching (RIE), will be used to form one or more trenches in the substrate material 12, through the openings of the resist. The resist can then be removed by a conventional oxygen ashing process or other known stripants. Following the resist removal, the insulator material, e.g., $SiO_2$ material, can be deposited by any conventional deposition processes, e.g., chemical vapor deposition (CVD) processes. Any residual material on the surface of the substrate 12 can be removed by conventional chemical mechanical polishing (CMP) processes.

Following the formation of the shallow trench isolation structures 14, a deep n-well implant 18 and a shallow n-well implant 20 are formed in the substrate 12. The shallow n-well implant 20 can be used to isolate regions from the substrate 12, e.g., p-type substrate. In embodiments, the deep n-well implant 18 is approximately 0.6 microns in depth and the shallow n-well implant 20 is about 0.3 microns in depth; although other implant depths are contemplated herein.

The deep n-well implant 18 and the shallow n-well implant 20 are formed by introducing a dopant by, for example, ion implantation that introduces a concentration of a dopant in the substrate 12. The dopant can be n-type dopants, e.g., Arsenic (As), Phosphorus (P) and Sb, among other suitable examples. During these implantation processes, the vertical pillar feature 16 (and other regions) can be blocked from receiving any dopants by using an implantation mask. The implantation mask may include a layer of a light-sensitive material, such as an organic photoresist, applied by a spin coating process, pre-baked, exposed to light projected through a photomask, baked after exposure, and developed with a chemical developer. The implantation mask has a thickness and stopping power sufficient to block masked areas against receiving a dose of the implanted ions.

Figure 2:
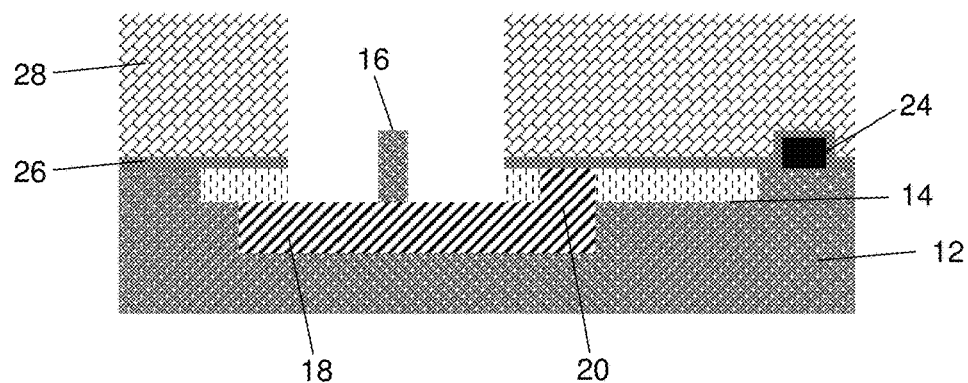
FIG. 2 shows the vertical pillar feature within a trench, amongst other features, and respective fabrication processes in accordance with aspects of the present disclosure.

FIG. 2 shows cross-sectional view of the vertical pillar feature 16 within a trench 22, amongst other features, and respective fabrication processes. In embodiments, the trench 22 is formed by the removal of the oxide material of the shallow trench isolation structures 14 around the vertical pillar feature 16. The insulator material can be removed by using a selective etch chemistry. As should be understood by those of skill in the art, the selective chemistry will only remove the oxide material of the shallow trench isolation structures 14, and will not attack (e.g., etch) the vertical pillar feature 16 and the underlying deep n-well implant 18, each of which are composed of the substrate material 12. The resist 28 will protect remaining portions of the shallow trench isolation structures 14 and device 24. In embodiments, the removal of the oxide material will result in the vertical pillar feature 16 within the trench 22, above and connecting to the deep n-well implant 18.

Prior to or after trench formation, one or more active or passive devices 24 can be formed on the substrate 12. In embodiments, the device(s) 24, e.g., a gate structure for a transistor, can be formed in any known manner such that no further explanation is required herein for a complete understanding of the present disclosure. Following the formation of the device 24, a protective film 26 can be formed over the device 24, following by the deposition of resist (masking material) which aids in the formation of the trench 22.

Figure 3:
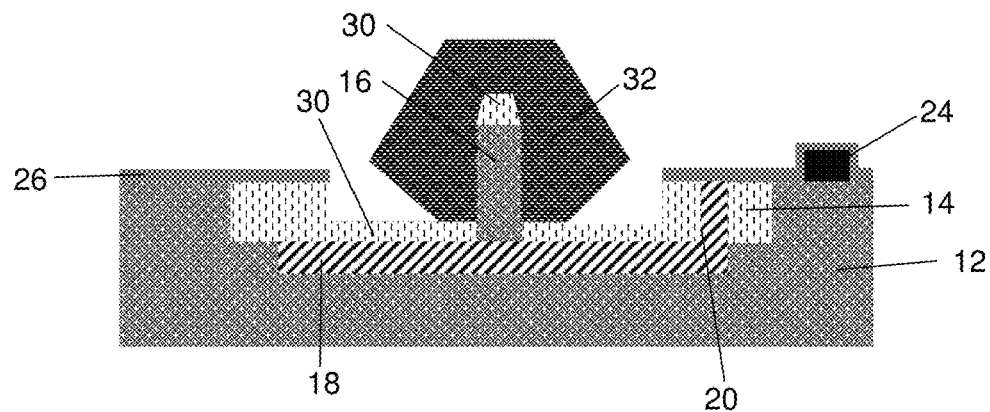
FIG. 3 shows a photodetector material grown on the vertical pillar feature, amongst other features, and respective fabrication processes in accordance with aspects of the present disclosure.

FIG. 3 shows a photodetector material 32 grown on the vertical pillar structure 16, amongst other features, and respective fabrication processes. The photodetector material 32 is an intrinsic photosensitive semiconductor material. In more specific embodiments, the photodetector material 32 is preferably Ge material which offers superior responsivity. In alternative embodiments, the photodetector material 32 can be Si, SiGe, etc. As further described herein, the photodetector material 32 will grow from laterally exposed sides of the vertical pillar structure 16 to form a dimensional structure, e.g., dome shape. The dimensional structure, e.g., dome shape, can be used to serve as a focusing feature (e.g., increase sensitivity).

Prior to the growth of the photodetector material 32, a blocking material 30, e.g., insulator material, is deposited on the exposed surfaces of the trench 22 and on a top surface of the pillar feature 16. The insulator material 30 can be an oxide material that is deposited to about 10% of the depth of the trench 22. Following the oxide deposition, an epitaxial material 32, e.g., photodetector material, is grown on the exposed sidewall surfaces of the vertical pillar feature 16. It should be understood that the insulator material 30, e.g., oxide, will prevent vertical growth of the photodetector material 32 and, as such, the photodetector material 32 will grow laterally from the sidewalls of the exposed semiconductor surfaces of the vertical pillar feature 16. This lateral growth will reduce defects from growth fronts merging from different planes.

Figure 4:
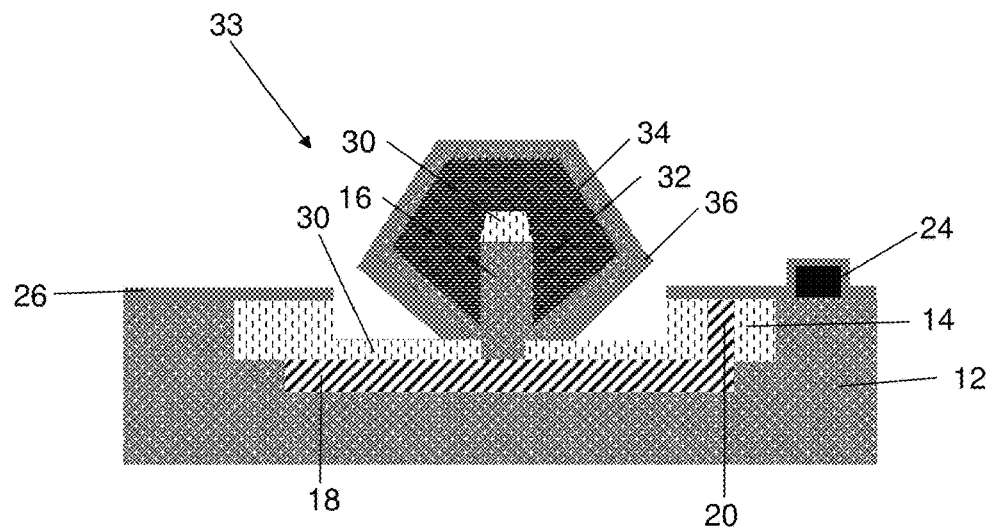
FIG. 4 shows a material on the photodetector material, amongst other features, and respective fabrication processes in accordance with aspects of the present disclosure.

In FIG. 4, a polysilicon or single crystalline silicon material 34 is grown or deposited on the photodetector material 32, followed by silicide process. The polysilicon material 34 is preferably p+ material deposited to a thickness of about 100 Å or more; although other dimensions are also contemplated herein. The polysilicon material 34 will act as a contact to the top of the photodiode 33. In embodiments, the insulator material 30 will prevent shorting between the deep n-well implant 18 and the p+ doped polysilicon material 34, in addition to acting as a mirror to reflect light back into the photodiode 33. In preferred embodiments, the polysilicon material 34 will grow only on the exposed photodetector material 32, e.g., semiconductor material. For example, the protective film 26 will prevent the polysilicon material 34 from growing in other regions of the device. Alternatively, any excess polysilicon material 34 grown or deposited on the structure outside of the trench can be removed by conventional lithography and etching processes.

Still referring to FIG. 4, in optional embodiments, a film 36, e.g., nitride or other hardmask material, will cover or isolate the polysilicon material 34 to prevent silicide forming on the top of the photodiode 33. The unsilicided top surface will provide optimal performance under front-side illumination of the photodiode 33. Also, the film 36, e.g., nitride layer, can be act as a mirror for backside illumination. Alternatively, for a backside illumination, the polysilicon material 34 can be silicided for contact formation.

As should be understood by those of skill in the art, the silicide process begins with deposition of a thin transition metal layer, e.g., nickel, cobalt or titanium, over the fully formed and patterned semiconductor devices (e.g., respective devices 24 and/or polysilicon material). After deposition of the material, the structure is heated allowing the transition metal to react with exposed silicon (or other semiconductor material as described herein) in the active regions of the semiconductor device (e.g., source, drain, gate contact region) forming a low-resistance transition metal silicide. Following the reaction, any remaining transition metal is removed by chemical etching, leaving silicide contacts in the active regions of the device. It should be understood by those of skill in the art that silicide contacts will not be required on the devices, when a gate structure is composed of a metal material.

Figure 5:
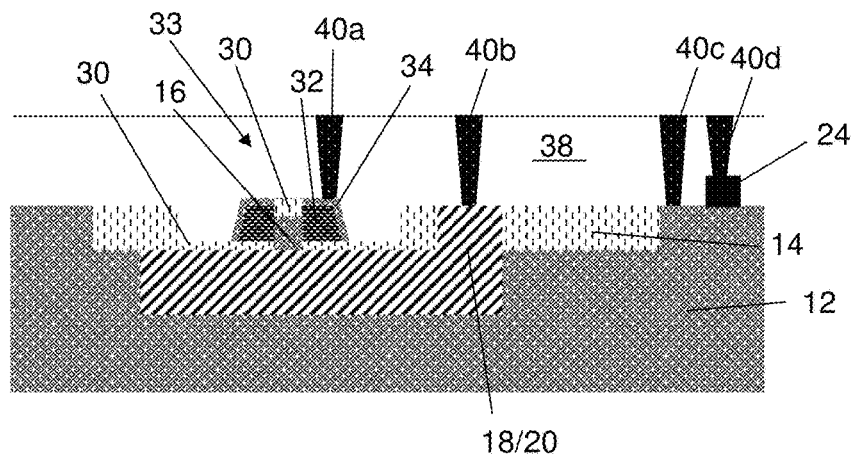
FIG. 5 shows contacts to the photodiode, amongst other features, and respective fabrication processes in accordance with aspects of the present disclosure.

FIG. 5 shows contact formation to the photodiode 33, amongst other features, and respective fabrication processes. In FIG. 5, an interlevel dielectric material (e.g., oxide) 38 is deposited over the structure. A plurality of trenches are formed in the interlevel dielectric material (e.g., oxide) 38, aligned with the photodiode 33, the shallow n-well implant 20, source/drain region 42 of the device 24, and the device 24, itself. The trenches are formed by conventional lithography and etching processes as already described herein. The trenches are filled with a metal material, e.g., tungsten, to form respective contacts 40a, 40b, 40c, 40d. As should be understood by those of skill in the art, the contact 40a is used to detect the current generated by the photons hitting the photodiode 33 (e.g., semiconductor material 32 of the photodiode 33).

It should be understood by those of ordinary skill in the art that the contact 40a and contact 40b can be a sensing electrode when the deep n-well implant 18 and the shallow n-well implant 20 are doped with a different dopant than the substrate. Moreover, some detectors can even use differential sensing with the contacts 40a, 40b as long as the deep n-well implant 18 and the shallow n-well implant 20 are doped opposite that of the substrate. If the deep n-well implant 18 and the shallow n-well implant 20 are doped the same as the substrate, then sensing is only done with the contact 40a. For example, if the contact 40b is a n-well contact and the substrate is P-type, then contacts 40a or 40b or both can be used for sensing. If, on the other hand, contact 40b is a substrate contact then contact 40a is only used for sensing.

Figure 6:
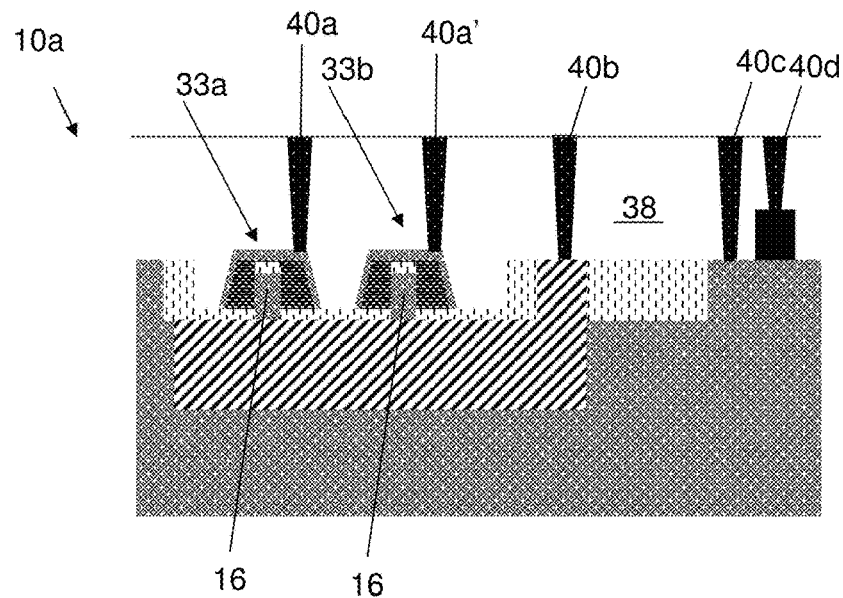
FIG. 6 shows a photodiode in accordance with additional aspects of the present disclosure.

FIG. 6 shows a photodiode structure 10a in accordance with additional aspects of the present disclosure. In this embodiment, the photodiode structure 10a includes multiple photodiodes 33a, 33b, fabricated about multiple vertical pillar features 16. In this embodiment, the multiple vertical pillar features 16 are spaced apart such that the photodetector material 32 does not merge together during its lateral growth process. Also, in this embodiment, each of the photodiodes 33a, 33b includes its own contact 40a, 40a'.

Figure 7:
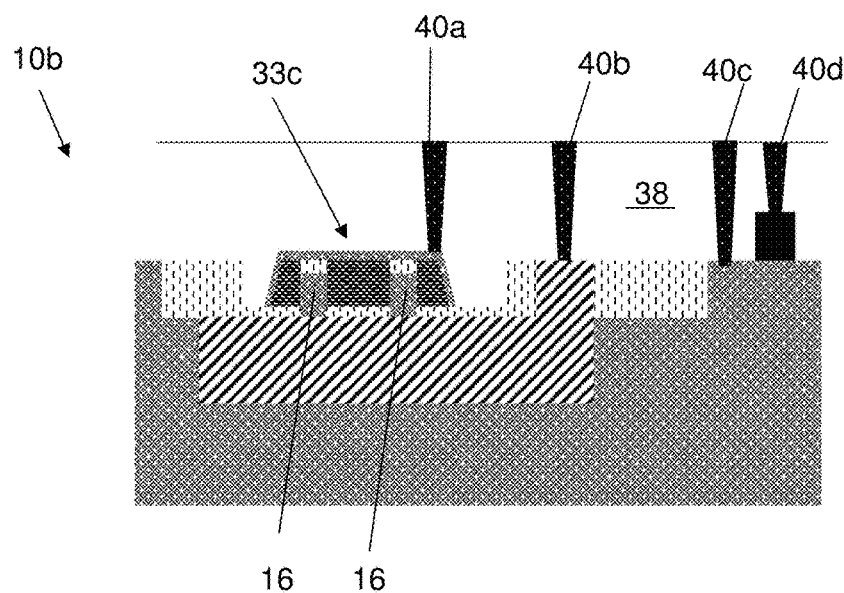
FIG. 7 shows a photodiode in accordance with yet additional aspects of the present disclosure.

FIG. 7 shows a photodiode structure 10b in accordance with yet additional aspects of the present disclosure. The photodiode structure 10b of FIG. 7 includes multiple vertical pillar features 16 which are spaced apart such that the photodetector material 32 grown from each of the vertical pillar features 16 will merge together during the lateral growth process. In this way, a single photodiode 33c with multiple vertical pillar features 16 can be fabricated. Also, in this embodiment, only a single contact 40a will be required from the single photodiode 33c with the multiple vertical pillar features 16.

Figure 8:
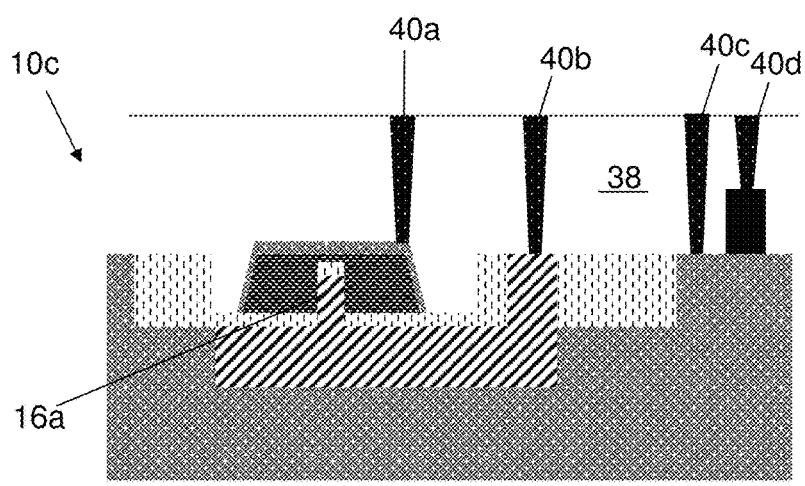
FIG. 8 shows a photodiode in accordance with further aspects of the present disclosure.

FIG. 8 shows a photodiode 10c in accordance with further aspects of the present disclosure. In this embodiment, the vertical pillar feature 16a can be n-doped semiconductor material. For example, in this embodiment, the vertical pillar feature 16a can be implanted with n-doped materials during the formation of the shallow n-well implants 20, as an example. In this scenario, the n-doped vertical pillar feature 16a will connect with the deep n-well implant 18. To form the n-doped vertical pillar feature 16a, the mask used over the vertical pillar feature as described above is now eliminated. It should also be understood by those of ordinary skill in the art that the photodiode structures 10a, 10b can also implement vertical pillar features with a n-doped implantation. In this way, each of the different structures can comprise a p-i-p-n avalanche photodiode structure.

The photodiodes and/or pin diode structures can be utilized in system on chip (SoC) technology. It should be understood by those of skill in the art that SoC is an integrated circuit (also known as a "chip") that integrates all components of an electronic system on a single chip or substrate. As the components are integrated on a single substrate, SoCs consume much less power and take up much less area than multichip designs with equivalent functionality. Because of this, SoCs are becoming the dominant force in the mobile computing (such as in Smartphones) and edge computing markets. SoC is also commonly used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure, comprising:
   at least one vertical pillar feature within a trench;
   a photosensitive semiconductor material extending laterally from sidewalls of the at least one vertical pillar feature; and
   a contact electrically connecting to the photosensitive semiconductor material.

2. The structure of claim 1, further comprising a blocking material on a bottom surface of the trench and a top of the at least one vertical pillar feature, wherein the at least one vertical pillar is comprised of substrate material and the blocking material is reflective insulator material.

3. The structure of claim 2, wherein the substrate material is Si material and the photosensitive material is undoped Ge material.

4. The structure of claim 1, wherein the at least one vertical pillar feature is embedded within the photosensitive semiconductor material.

5. The structure of claim 4, wherein the at least one vertical pillar feature is multiple vertical pillar features.

6. The structure of claim 5, wherein the photosensitive semiconductor material spans between the multiple vertical pillar features.

7. The structure of claim 5, wherein the photosensitive semiconductor material separately embeds each of the multiple vertical pillar features without contacting one another.

8. The structure of claim 1, wherein the at least one vertical pillar feature is n-doped material connecting to an n-well implant under the trench.

9. The structure of claim 1, further comprising an active or passive device outside of the trench.

10. The structure of claim 1, further comprising a p+ poly material surrounding the photosensitive semiconductor material and the contact is connecting to the p+ poly material.

11. The structure of claim 1, wherein the photosensitive semiconductor material is domed shape above a surface of the trench.

12. A structure, comprising:
    a trench within substrate material;
    a deep n-well implant region under the trench;
    shallow trench isolation regions isolating the trench;
    at least one vertical pillar feature extending upwardly within the trench;
    an insulator material at a lower portion of the trench;
    a photosensitive material above the insulator material and embedding the at least one vertical pillar feature; and
    semiconductor material lining the photosensitive material.

13. The structure of claim 12, wherein the at least one vertical pillar is Si material, the photosensitive material is undoped Ge material, the insulator material is reflective material, and the semiconductor material is p+ polysilicon.

14. The structure of claim 13, wherein the at least one vertical pillar is n-doped material connecting to the deep n-well implant region under the trench.

15. The structure of claim 14, wherein the at least one vertical pillar feature is multiple vertical pillar features.

16. The structure of claim 15, wherein the photosensitive semiconductor material spans between the multiple vertical pillar features.

17. The structure of claim 15, wherein the photosensitive semiconductor material separately embeds each of the multiple vertical pillar features without contacting one another.

18. The structure of claim 12, further comprising an active or passive device outside of the trench.

19. The structure of claim 12, wherein the photosensitive semiconductor material is domed shape.

20. A method comprising:
    forming at least one vertical pillar feature within a trench;
    forming a photosensitive semiconductor material extending laterally from sidewalls of the at least one vertical pillar feature; and
    forming a contact electrically connecting to the photosensitive semiconductor material.

* * * * *